United States Patent [19]
Ohashi

[11] Patent Number: 5,274,653
[45] Date of Patent: Dec. 28, 1993

[54] SEMICONDUCTOR LASER DRIVING SYSTEM FOR DRIVING A SEMICONDUCTOR LASER ELEMENT

[75] Inventor: Tsuyoshi Ohashi, Hashima, Japan

[73] Assignee: Brother Kogyo Kabushiki Kaisha, Nagoya, Japan

[21] Appl. No.: 814,557

[22] Filed: Dec. 30, 1991

[30] Foreign Application Priority Data

Feb. 15, 1991 [JP] Japan .................. 3-021901

[51] Int. Cl.$^5$ ............................... H01S 3/10
[52] U.S. Cl. ..................................... 372/31
[58] Field of Search ................... 372/29, 31, 38

[56] References Cited

U.S. PATENT DOCUMENTS

| | | | |
|---|---|---|---|
| 4,847,492 | 7/1989 | Houki | 250/235 |
| 4,907,236 | 3/1990 | Shimada | 372/31 |
| 5,123,023 | 6/1992 | Santarelli et al. | 372/29 |

FOREIGN PATENT DOCUMENTS 57-64265 4/1982 Japan .

Primary Examiner—James W. Davie
Attorney, Agent, or Firm—Oliff & Berridge

[57] ABSTRACT

A semiconductor laser driving system for driving a semiconductor laser element which emits a laser beam. The semiconductor laser element has characteristic wherein the intensity of the laser beam emitted from the semiconductor laser element is changed in accordance with the magnitude of an electric current applied to the semiconductor laser element and speed of change in the intensity of the emitted laser beam is high in case where the applied electric current flows in the semiconductor laser element. The semiconductor laser driving system comprises an applying unit for applying the electric current to the semiconductor laser element and controlling unit for controlling the electric current of the driving unit so that a light intensity of the laser beam is kept constant when the laser beam is emitted in either the high or low emitting conditions with the light intensity of the laser beam in the high emitting condition higher than the light intensity of the laser beam in the low emitting condition.

9 Claims, 10 Drawing Sheets

SEMICONDUCTOR LASER DRIVING SYSTEM FOR DRIVING A SEMICONDUCTOR LASER ELEMENT

BACKGROUND OF THE INVENTION

1. Field of the Invention

The invention relates to a semiconductor laser driving system for driving a semiconductor laser element and more particularly to a semiconductor laser driving system which can change the intensity of the laser beam, at high speed, emitted from the semiconductor laser element.

2. Description of the Prior Art

In a conventional semiconductor laser driving system of this type, as is disclosed in Japanese examined patent publication No. 14585/89, a semiconductor laser element is turned on and off according to recording signals which are applied to the semiconductor laser driving system. When the recording signal indicates that a white color image is to be formed on a recording sheet, the semiconductor laser driving system applies an electric current, corresponding to the recording signal, to the semiconductor laser element so that the semiconductor laser element emits a laser beam, that strikes the photosensitive material, based on the electric current. When the recording signal indicates that a black color image is to be formed on a recording sheet, the semiconductor laser driving system does not apply an electric current to the semiconductor laser element and the semiconductor laser element does not emit a laser beam to strike the photosensitive material.

In the conventional semiconductor laser driving system, a constant electric current is applied to the semiconductor laser element when the semiconductor laser element is turned on based on the recording signal, so that the semiconductor laser element emits a constant level laser beam if the temperature of the semiconductor laser element is constant.

However the semiconductor laser element has the disadvantage that it spends a long period of time turning the laser element on and off. As the result, the recording apparatus employing the known semiconductor laser driving system has the disadvantage that the recording speed is low.

SUMMARY OF THE INVENTION

The invention solves the above-mentioned problem. It is an object of the invention to provide a semiconductor laser driving system which can change the intensity, at high speed, of the laser beam emitted from a semiconductor laser element.

Another object of the invention is to provide a semiconductor laser driving system for use in the recording apparatus where the recording speed is high.

Another object of the invention is to provide a semiconductor laser driving system which prevents a change in the intensity of the laser beam when the temperature changes.

In order to achieve the above-mentioned objects, the semiconductor laser driving system of the invention comprises:

a semiconductor laser element for emitting a laser beam, the semiconductor laser element having a characteristic where an intensity of the laser beam emitted from the semiconductor laser element is changed in accordance with a magnitude of an electric current applied to the semiconductor laser element and a speed of change in the intensity of the emitted laser beam is high when the electric current flows in the semiconductor laser element;

an applying unit for applying the electric current to the semiconductor laser element; and a controlling unit for controlling the electric current of the driving unit so that a light intensity of the laser beam is kept at a constant first level when the semiconductor laser is emitted in a high emitting condition and the light intensity of the laser beam is kept at a constant second level when the semiconductor laser is emitted in a low emitting condition when the electric current flows in the semiconductor laser element, the light intensity of the laser beam in the high emitting condition being higher than the light intensity of the laser beam in the low emitting condition.

According to the invention having the above described structure, the controlling unit controls the driving unit so that a light intensity of the laser beam is kept at a constant first level when the semiconductor laser element emits the laser beam in a high emitting condition and that the light intensity of the laser beam is kept at a constant second level when the semiconductor laser element emits the laser beam in a low emitting condition when the electric current flows in the semiconductor laser element. When the applying unit applies the electric current, as controlled by the controlling unit, to the semiconductor laser element, the semiconductor laser element emits a laser beam based on the controlled electric current. At this time, the intensity of the laser beam emitted from the semiconductor laser element is changed in accordance with magnitude of the controlled electric current applied to the semiconductor laser element and the speed of the change in the intensity of the emitted laser beam is very rapid.

BRIEF DESCRIPTION OF THE DRAWINGS

The above and other objects, features and advantages of the invention will become more apparent from reading the following description of the preferred embodiments taken in connection with the accompanying drawings in which.

DETAILED DESCRIPTION OF A PREFERRED EMBODIMENT

An embodiment of the invention will be described in detail hereinunder with reference to the accompanying drawings.

Figure 10:
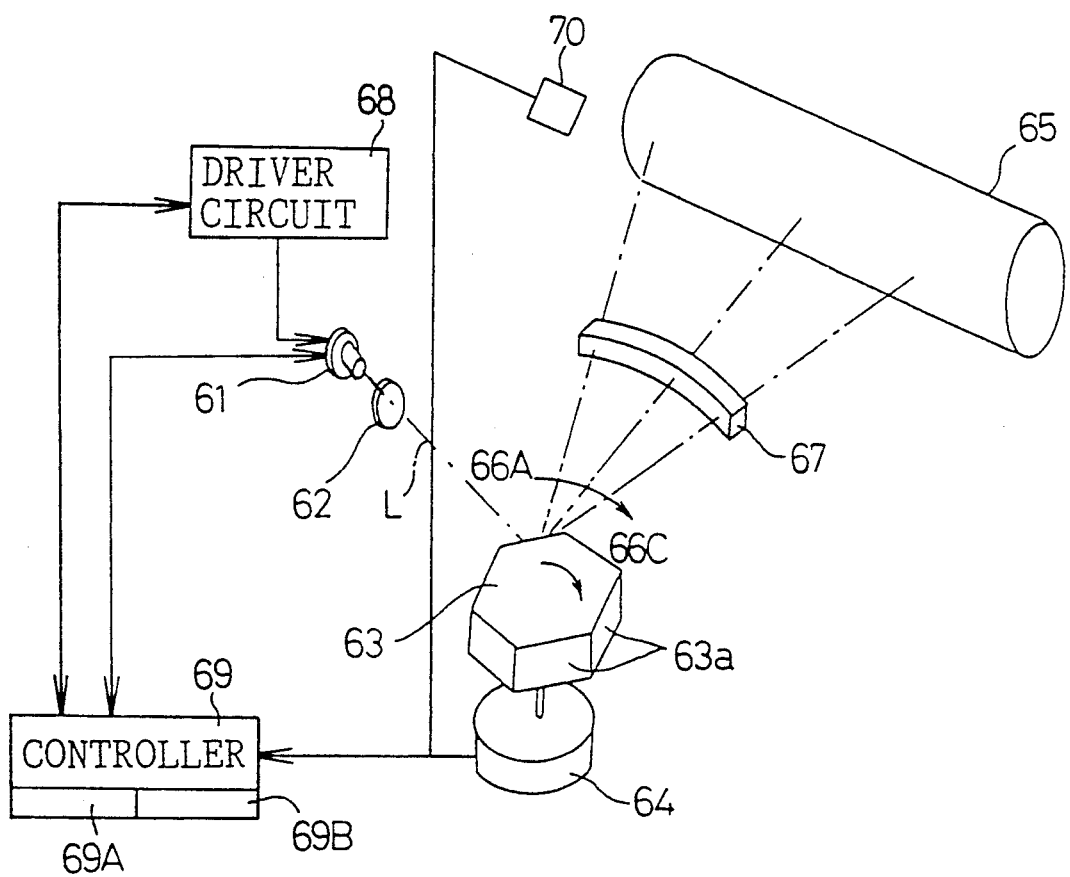
FIG. 10 is a schematic diagram showing an exposure apparatus of a recording system of an electrophotographic type.

Referring to FIG. 10, a semiconductor laser member 61 is electrically connected to a laser driver circuit 68, which functions as an applying means, for driving the semiconductor laser member 61. A collimator lens 62 is disposed with its optical axis in alignment with that of the semiconductor laser member 61. A laser beam L emitted by the semiconductor laser member 61 is collimated by the collimator lens 62 and falls on a polygonal rotating mirror 63. The polygonal rotating mirror 63 is rotated by a motor 64.

The driver circuit 68 is electrically connected to a controller 69 so that the controller 69, which functions as controlling means, controls the driver circuit 68, in particular, to control the scanning exposure on a photoconductive drum 65 described below. The controller 69 has a storage device 69A, such as a RAM or a floppy disk, which stores a multiplicity of image data. The image data includes recording data indicating that an image, for example, a black color image is formed thereon and exposure position data representing exposure positions of the image in relation with the recording data. The storage device 69A is capable of storing at least an amount of image data corresponding to an entire recording sheet.

Figure 1:
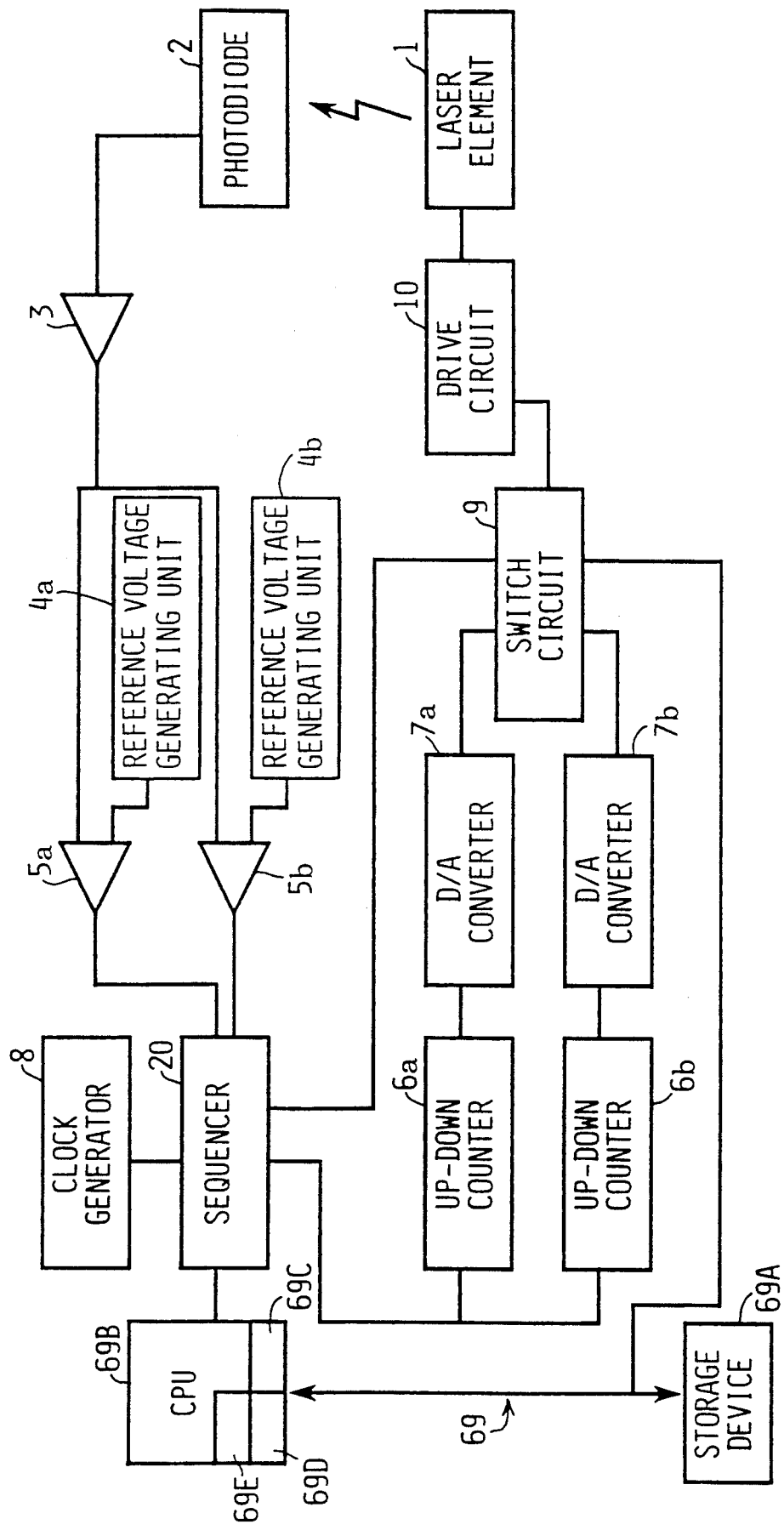
FIG. 1 is a block diagram showing the structure of semiconductor laser driving system according to an embodiment of the invention.

The controller 69 also has a CPU 69B which reads the image data from the storage device 69A. The CPU 69B, as shown in FIG. 1, comprises a ROM 69C for storing a program to control the CPU 69B, a timer 69E for controlling the CPU 69B and a RAM 69D for storing data used in the control of the CPU 69B. The motor 64 is electrically connected to the controller 69 to maintain a constant rotation of the motor 64.

The polygonal rotating mirror 63 is rotated by the motor 64 to reflect the laser beam L so that the laser beam L is swept along the surface of the photoconductive drum 65. A f-θ lens 67 is disposed between a photoconductive drum 65 and the polygonal rotating mirror 63. The laser beam L passes through the f-θ lens 67 and falls in a spot on the photoconductive drum 65. The spot of the laser beam L moves axially on the photoconductive drum 65 for a scanning exposure.

At a left side of the photoconductive drum 65, a photodetector 70 is disposed to detect that the laser beam L has reached a predetermined position prior to scanning the photoconductive drum 65. The photodetector 70 is electrically connected to the controller 69 so that the photodetector 70 transmits the detecting signal to the controller 69.

Arranged around the photoconductive drum 65 are a charger (not shown) for charging the photoconductive drum 65 universally, an ink toner case (not shown) for storing ink toners, and a cleaning unit (not shown) for cleaning the photoconductive drum 65 to remove the ink toners attached to the photoconductive drum 65. The charger, the ink toner case, and the cleaning unit are known in the art (see, for example, U.S. Pat. No. 4,847,492) and detailed descriptions are therefore omitted.

Figure 11:
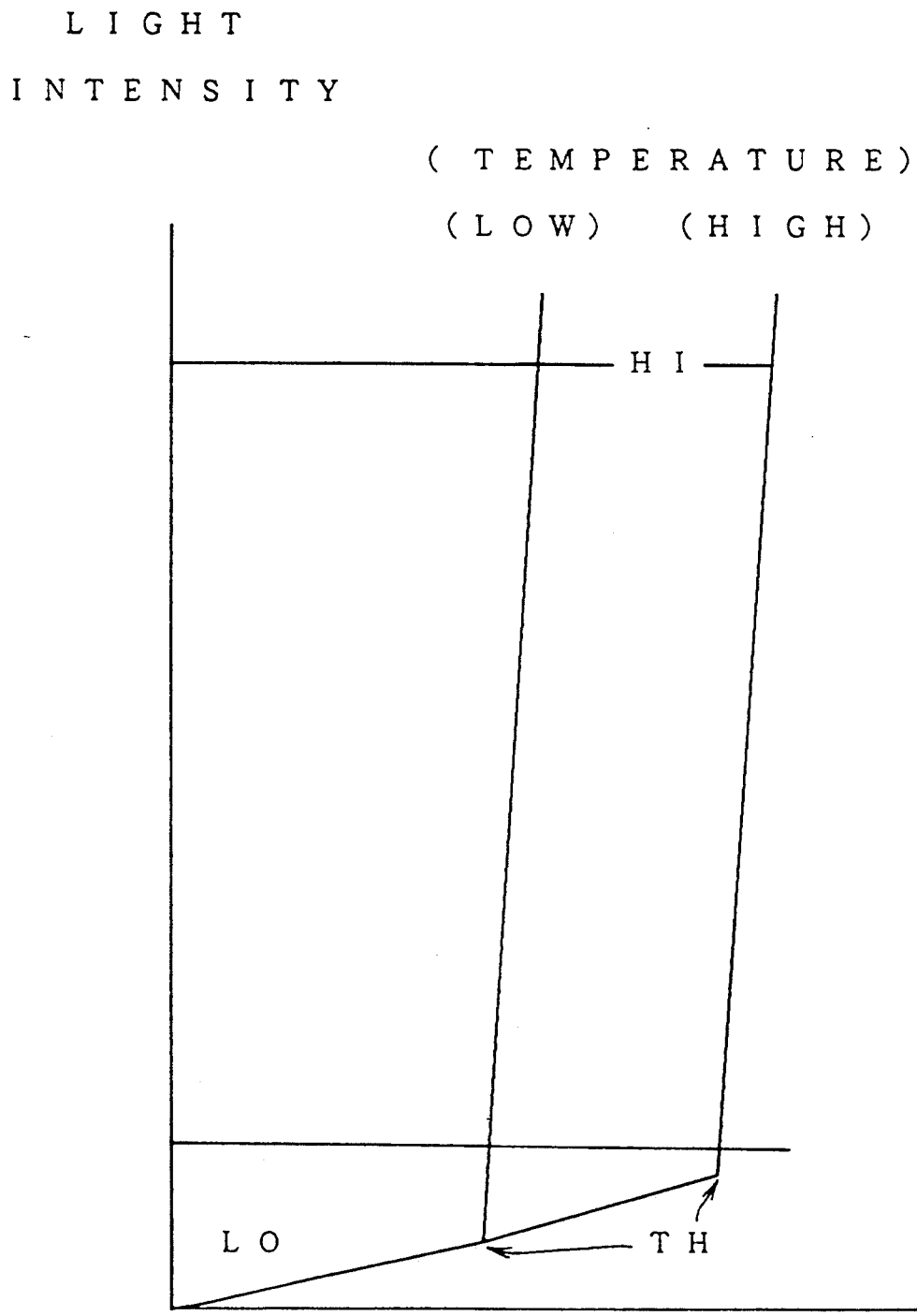
FIG. 11 is a graph showing a characteristic of the semiconductor laser element.

The intensity of the laser beam emitted from the semiconductor laser member 61 is changed in accordance with the magnitude of an electric current corresponding to the recording signal applied to the semiconductor laser member 61 by the laser driver circuit 68. As shown in FIG. 11, the semiconductor laser element 1, such as a laser diode, (FIGS. 2) in the semiconductor laser member 61 has the characteristic that the intensity of laser beam emitted from the semiconductor laser element 1 is changed in accordance with a change of temperature and the magnitude of the electric current applied to the semiconductor laser member 61. The intensity HI of the laser beam emitted from the semiconductor laser element 1 is determined when the laser beam is emitted in a high emitting condition, and intensity LO of the laser beam emitted from the semiconductor laser element 1 is determined when the laser beam is emitted in a low emitting condition and produces the characteristics of the laser element 1 shown in FIG. 11.

The intensity of the laser beam emitted from the semiconductor laser element 1 in the high emitting condition is about twenty times as large as the intensity of the laser beam emitted from the semiconductor laser element 1 in the low emitting condition. The semiconductor laser element has the characteristic wherein the speed of change in intensity of the emitted laser beam is high in case of going from the low emitting condition, where a low level electric current flows in the semiconductor laser element, to the high emitting condition with an increase in the applied current, in particular, when the electric current applied to the semiconductor laser element 1 is larger than a threshold current TH applied to the semiconductor laser member 61 the increase is very rapid. Comparing speed of turn on and off of the semiconductor laser element 1 in the conventional apparatus, that is going from an off state to a high emitting state, with the speed of change between in the high emitting condition and the low emitting condition where the electric current flows in the semiconductor laser element 1 of the invention, the latter is several times as fast as the former. The magnitude of the threshold current in the semiconductor laser element of the embodiment is about 40-60 mA.

Adjustment of the current applied to the semiconductor laser element 1 in the high emitting condition is required based upon detection, by a sensor (not shown), of the temperature of the semiconductor laser element 1 in the high emitting condition. The sensor for detecting the temperature of the semiconductor laser element and a control device for controlling the temperature of the semiconductor laser element 1 are disclosed in Japanese Examined Patent Publication No. 14585/89, the disclosure of which is incorporated herein by reference.

Figure 12:
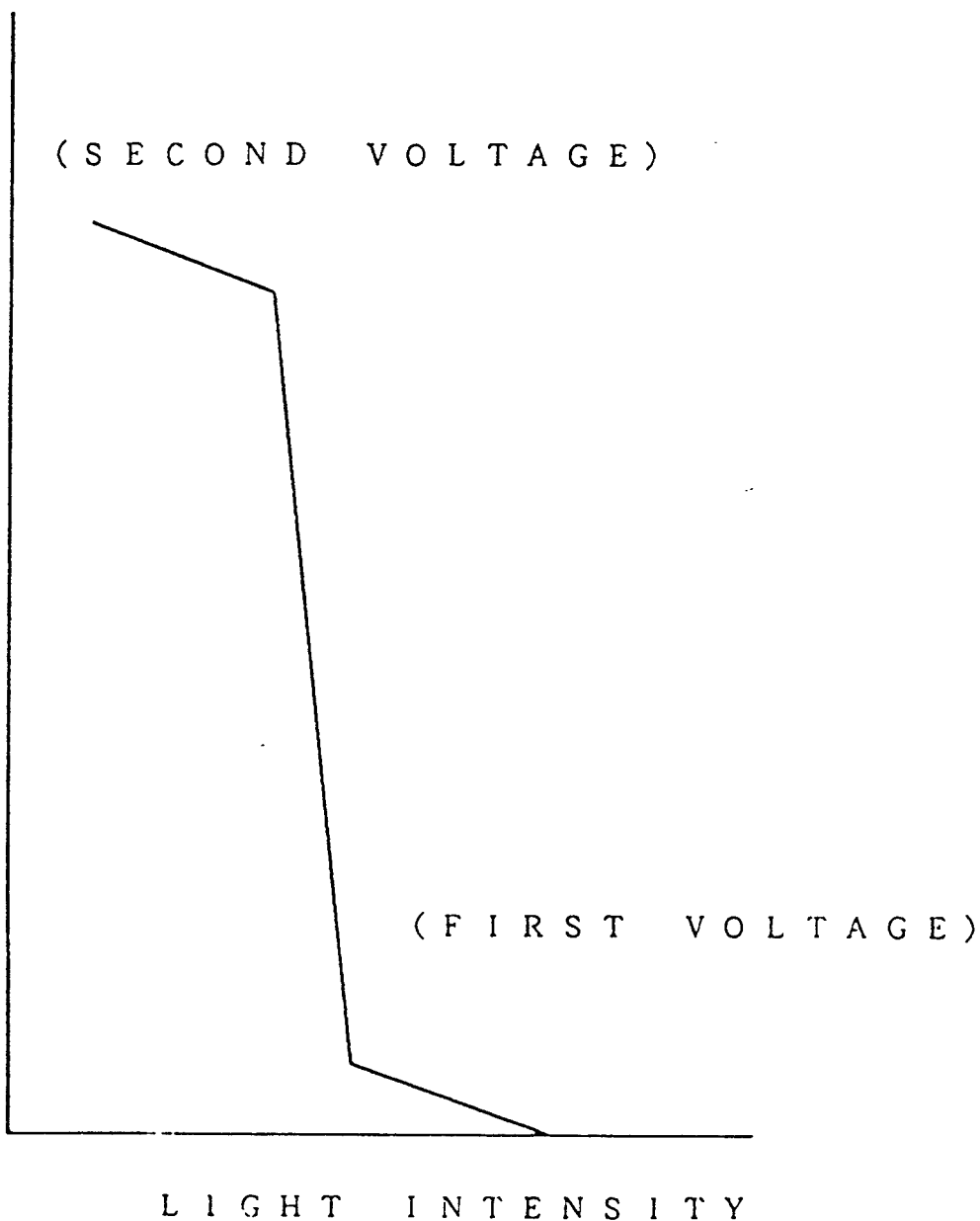
FIG. 12 is a graph showing a characteristic of the photosensitive material employed in a recording system of an electrophotographic type.

The photoconductive material of the photoconductive drum 65, after being charged by the charger, which receives the laser beam L emitted from the semiconductor laser member 61, has the characteristic that the voltage is changed between a first voltage for attracting charged ink toners and a second voltage for being neutral to the charged ink toners, and therefore not attracting and adhering the charged ink toners, in accordance with the light intensity of the received laser beam thereon. The characteristic charge of the photoconductive material in the photoconductive drum 65 is illustrated in FIG. 12 and shows the second voltage, i.e., the applied charge, decreases to the first voltage (no charge) generally in proportion to the amount of the laser beam L received. However, the second voltage does not decrease greatly when the photoconductive material receives little of the laser beam. Therefore, when the semiconductor laser member 61 emits the laser beam L in a low emitting condition, that is, where the low electric current is flowing in the semiconductor laser element 1, the photoconductive material in the photoconductive drum 65 substantially maintains its second voltage, i.e., the initial charge.

The structure of the semiconductor laser driving system including the semiconductor laser member 61, the laser driving circuit 68 and the controller 69 will be described with reference to FIG. 1.

Figure 2:
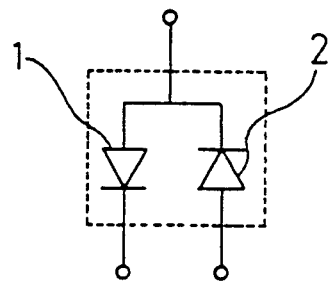
FIG. 2 is a diagram showing the electrical structure of a semiconductor laser.
Figure 3:
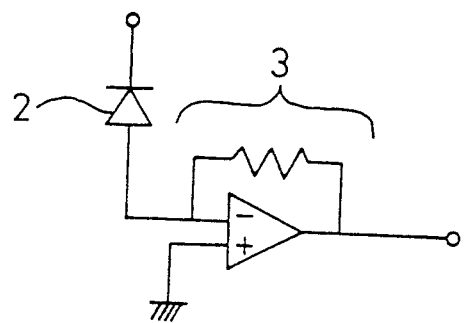
FIG. 3 is a circuit diagram showing a circuit configuration of a photodiode and an amplifier.

The semiconductor laser member 61 comprises a semiconductor laser element 1 and a photodiode 2 which functions as a detecting means. The semiconductor laser element 1 and the photodiode 2 are sealed in the same package, as shown in FIG. 2, and are arranged so that part of the laser beam L emitted from the semiconductor laser element 1 is incident on the photodiode 2. The laser light incident on the photodiode 2 is converted to an electric current. An input terminal of an amplifier 3 is connected to an output terminal of the photodiode 2 so that the amplifier 3 amplifies the electric current and converts it to a voltage signal which is hereinafter referred to as the light intensity signal (FIG. 3).

An output terminal of the amplifier 3 is connected to the input terminals of two comparators 5a and 5b. A second input terminal of the comparators 5a and 5b is connected to reference voltage generating units 4a and 4b, respectively, for generating a high-level reference signal and a low-level reference signal, respectively. The reference voltage generating unit 4a, for generating the high-level reference signal, and the reference voltage generating unit 4b, for generating the low-level reference signal, are produced by known circuits combining Zener diodes with resistances. The reference voltage generating unit 4a is employed in a first control operation for adjusting the light intensity of a high level as described below. The reference voltage generating unit 4b is employed in a second control operation for adjusting the light intensity of a low level as described below. The light intensity signal is compared with the high-level reference signal output from the reference voltage generating unit 4a in the comparator 5a and compared with the low-level reference signal output from the reference voltage generating unit 4b in the comparator 5b.

The output from the output terminal of the comparator 5a, indicating that the light intensity signal is equal to or greater than the high-level reference signal, is then fed to a sequencer 20. Output from the output terminal of the comparator 5b, indicating that the light intensity signal is equal to or greater than the low-level reference signal, is also fed to the sequencer 20.

The sequencer 20 is electrically connected to a clock generator 8, up-down counters 6a and 6b, a switch circuit 9 and the CPU 69B. The sequencer 20 operates in accordance with clock pulses generated from the clock generator 8 and transmits clock signals to the up-down counters 6a and 6b in accordance with an external control signal output from the CPU 69B and on the basis of the status in the comparators 5a and 5b.

Figure 4:
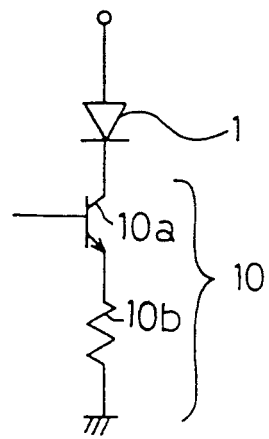
FIG. 4 is a circuit diagram showing a drive circuit configuration.

The up-down counters 6a and 6b are electrically connected to D/A converters 7a and 7b, respectively and the D/A converters 7a and 7b are electrically connected to the switch circuit 9. The switch circuit 9 is electrically connected to the drive circuit 10 which comprises a switching transistor 10a and a resistor 10b, as shown in FIG. 4. Count values from the up-down counters 6a and 6b, which determine the intensity of the laser beam L, are fed to D/A converters 7a and 7b and the D/A converters 7a and 7b convert the input digital signals to analog signals. The up-down counter 6a and the D/A converter 7a are employed in the first control operation for adjusting the light intensity of a high level to be described below. The up-down counter 6b and the D/A converter 7b are employed in the second control operation for adjusting the light intensity of a low level to be described below.

The operation of changing between light intensity HI and LO of the laser beam L, emitted from the semiconductor laser member 61, is referred to as a modulating operation of the laser beam L and the modulating operation of the laser beam L is carried out on the photoconductive drum 65 to form the image thereon.

The operation of the recording apparatus constructed as above will be described below with reference to FIGS. 1, 9 and 10.

When the semiconductor laser member 61 is driven by the laser driving circuit 68 to emit the laser beam L, the polygonal rotating mirror 63, rotated by the motor 64, reflects the laser beam L to deflect the laser beam L. When the photodetector 70 detects that the laser beam L has reached the predetermined position prior to the photoconductive drum 65, it transmits the detecting signal to the controller 69. The CPU 69B starts to calculate timing pulses determined between the predetermined position of the photodetector 70 and start position of recording operation on the photoconductive drum 65 using the timer 69E. When a control signal from the photodetector 70 is input to the sequencer 20, through the CPU 69B during the period of the modulating operation, the sequencer 20 performs the following two control operations for adjusting the light intensity in an alternating manner.

Figure 5:
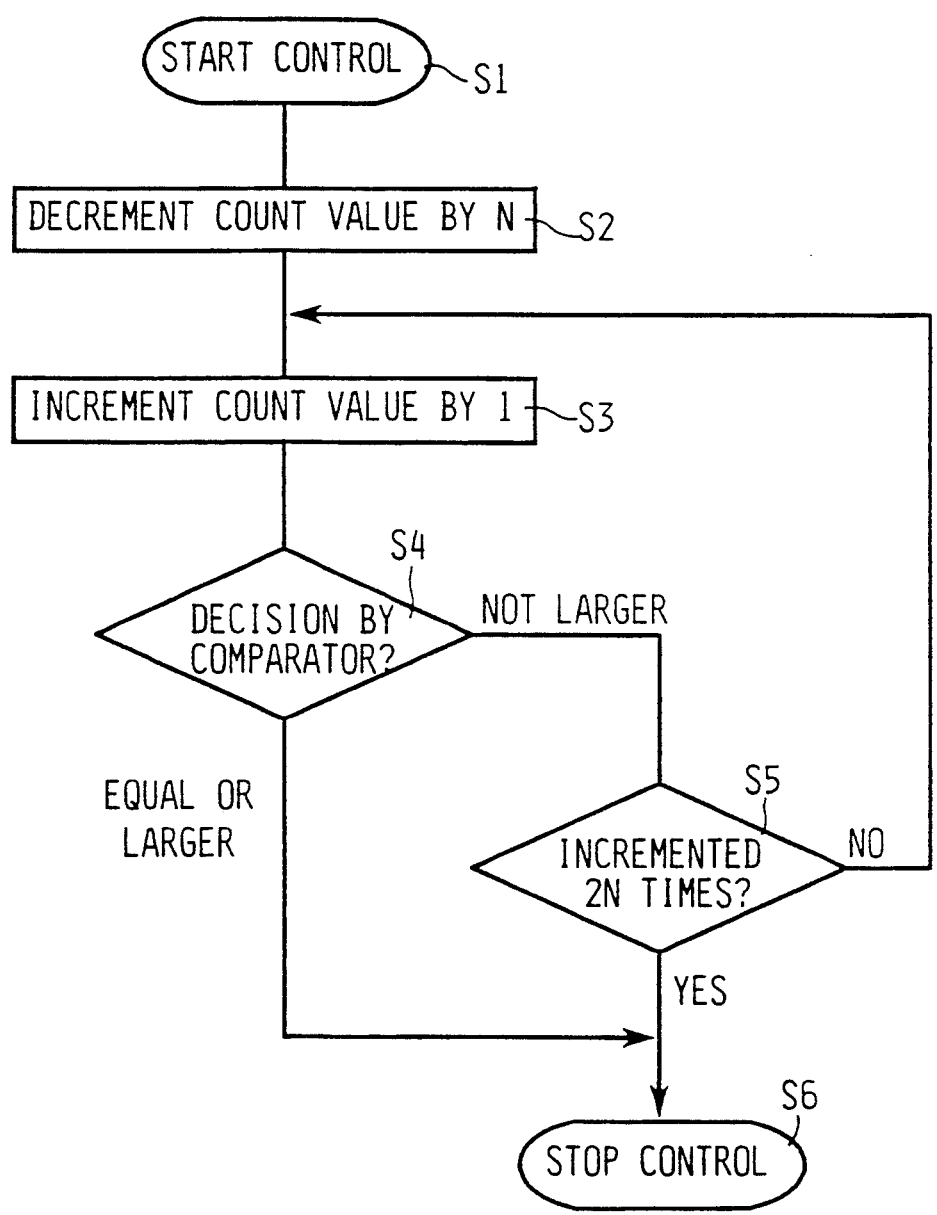
FIG. 5 is a flowchart showing a first control operation.

The first control operation for adjusting the light intensity of a high level is performed as follows by the sequencer 20. The first control operation is illustrated in the flowchart of FIG. 5.

The switch circuit 9 is switched to be electronically connected to the D/A converter 7a so that an electric current, according to the count value of the up-down counter 6a, flows through the semiconductor laser element 1 as start control (STEP S1). The count value of the up-down counter 6a is decreased by a predetermined value N (STEP S2). If the count value of the up-down counter 6a is value M, the count value after the decrease is value M−N. The count value of the up-down counter 6a is then increased by one (STEP S3). The sequencer 20 judges whether the light intensity signal detected by the photodiode 2, through the amplifier 3, is equal to or larger than the magnitude of the high-level reference signal (STEP S4). If the judgement in STEP S4 is NO, the sequencer 20 judges whether the number of times of the increment has reached 2N (STEP S5). If the judgement in STEP S5 is NO, the sequencer 20 returns to STEP S3. If the judgement in STEP S4 is YES, the control operation of the sequencer 20 is terminated as a stop control (STEP S6).

With value M+N as an upper limit, the count value of the up-down counter 6a is incremented one at a time until the comparator 5a detects that the light intensity signal is equal to or greater than the high-level reference signal (STEP S4). More particularly, the count value of the up-down counter 6a is incremented and judgment is made on the basis of the output of the comparator 5a as to whether the light intensity signal detected by the photodiode 2 through the amplifier 3 is equal to or greater than the magnitude of the high-level reference signal output from the voltage generating unit 4a. If the light intensity signal is equal to or greater than the magnitude of the high-level reference signal, the first control operation is terminated and data representing the count value of the up-down counter 6a when the first control operation is terminated is stored in the RAM 69C. The data representing the count value stored in the RAM 69C is used in the modulating operation of the laser beam until the next first control operation is carried out. If the answer is negative, in STEP S4, the count value of the up-down counter 6a is incremented. When the number of times of the increment reaches 2N, in STEP S5, the first control operation for adjusting the light intensity of high level is terminated (STEP S6).

Figure 6:
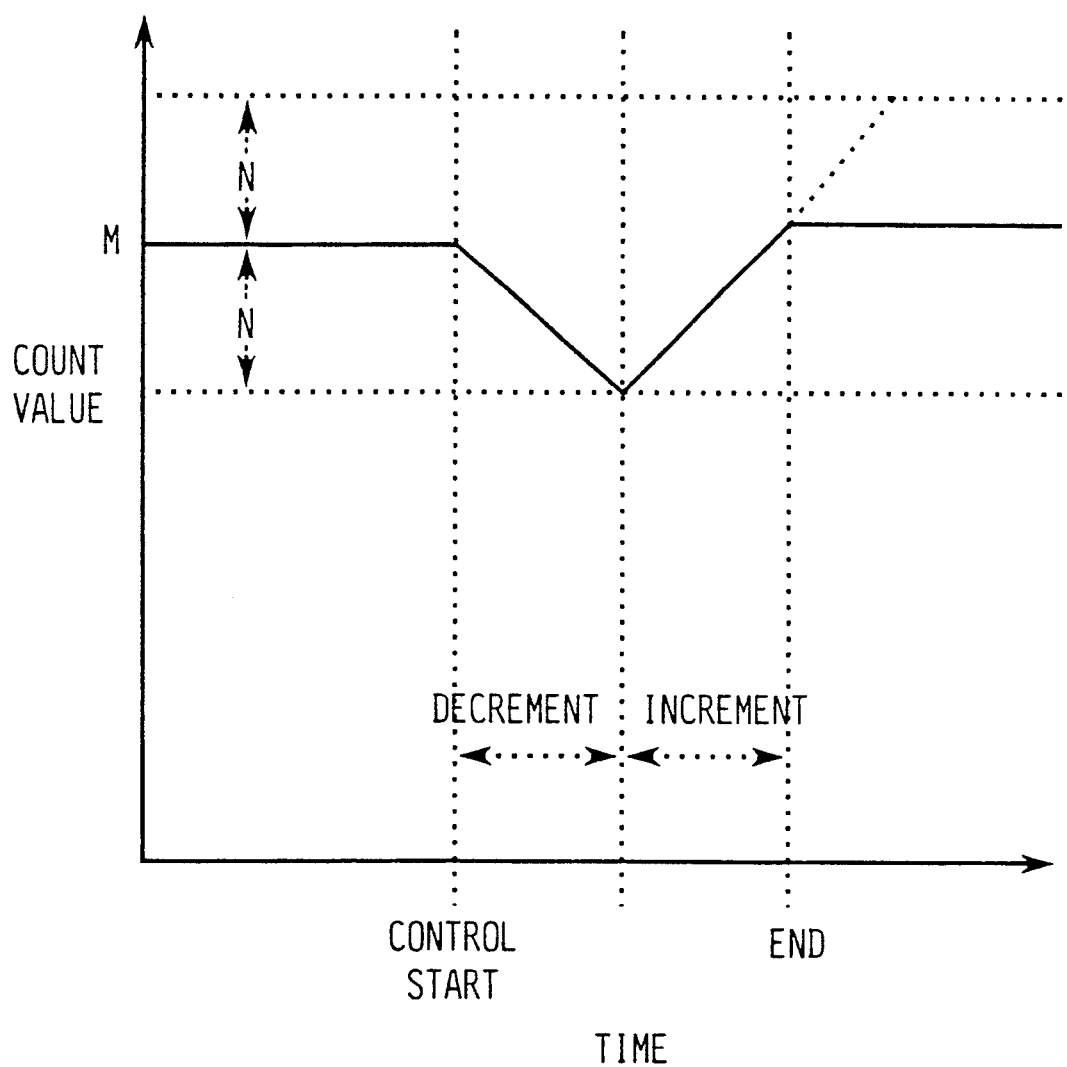
FIG. 6 is a diagram showing the changes of count values in an up-down counter in the first control operation.

Thus, since the first control operation is performed to keep the light intensity constant by changing the electric current flowing through the semiconductor laser element 1, the high-level light beam emitted from the semiconductor laser element 1 is constant in its intensity even when the temperature changes causing changes in the threshold current and the quantum differential efficiency of the laser semiconductor element 1 which is defined as a current-light conversion efficiency. The reason why the upper limit of the count value of the up-down counter 6a is value M+N is that the time capable of being consumed for the first control operation is in the intervals of the modulating operation and thus is limited. In the first control operation, the count value can change by, at most, a value 2N. FIG. 6 shows the manner in which the count value changes.

Figure 7:
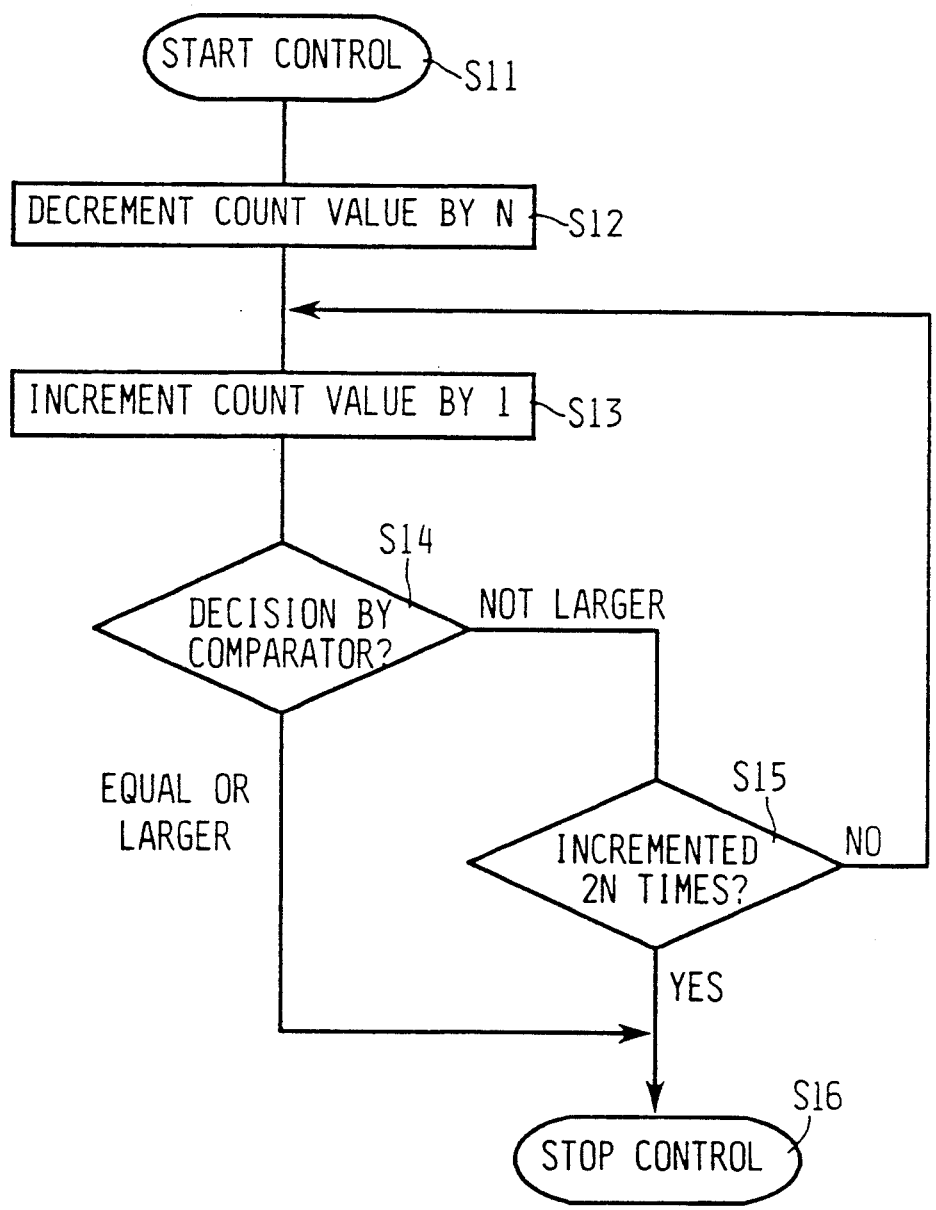
FIG. 7 is a flowchart showing a second control operation.

The second control operation for adjusting the low-level light intensity, is performed as follows by the sequencer 20. The second control operation is illustrated in the flowchart of FIG. 7.

The switch circuit 9 is switched over to be electronically connected to the D/A converter 7b and an electric current proportional to the count value of the up-down counter 6b is allowed to flow through the semiconductor laser element 1 as a start control (STEP S11). The count value of the counter 6b is then decreased by a predetermined value N (STEP S12). If the count value of the counter 6b is decreased by a predetermined value N and the initial count value of the counter 6b is L, the count value after the decrement is L−N. The count value of the up-down counter 6b is incremented by one at STEP S13. The sequencer 20 judges whether the light intensity signal detected by the photodiode 2, through the amplifier 3, is equal to or greater than the magnitude of the low-level reference signal (STEP S14). If the judgement in STEP S14 is NO, the sequencer 20 judges whether the number of times of the increment has reached 2N (STEP S15). If the judgement in STEP S15 is NO, the sequencer 20 returns to STEP S13. If the judgement in STEP S14 is YES, the control operation of the sequencer 20 is terminated by a stop control (STEP S16). If the judgement in STEP S15 is YES, the control operation of the sequencer 20 is also terminated (STEP S16).

With value L+N as an upper limit, the count value of the up-down counter 6b is incremented one at a time until the comparator 5b detects that the light intensity signal is equal to or greater than the low-level reference signal (STEP S14). More particularly, the count value of the counter 6b is incremented and a judgment is made on the basis of the output of the comparator 5b as to whether the light intensity signal detected by the photodiode 2 through the amplifier 3 is equal to or greater than the low-level reference signal output from the low voltage generating unit 4b. If the light intensity signal is equal to or greater than the low-level reference signal, in STEP S14, the second control operation is terminated (STEP S16) and data representing the count value of the up-down counter 6b when the second control operation is terminated is stored in the RAM 69C. The data representing the count value stored in the RAM 69C is used in the modulating operation of the laser beam until the next second control operation is carried out. When the answer is negative, the count value of the up-down counter 6b is incremented. When the number of times of the increment has reached 2N (STEP S15), the second control operation for adjusting the light intensity of low level is terminated (STEP S16).

Figure 8:
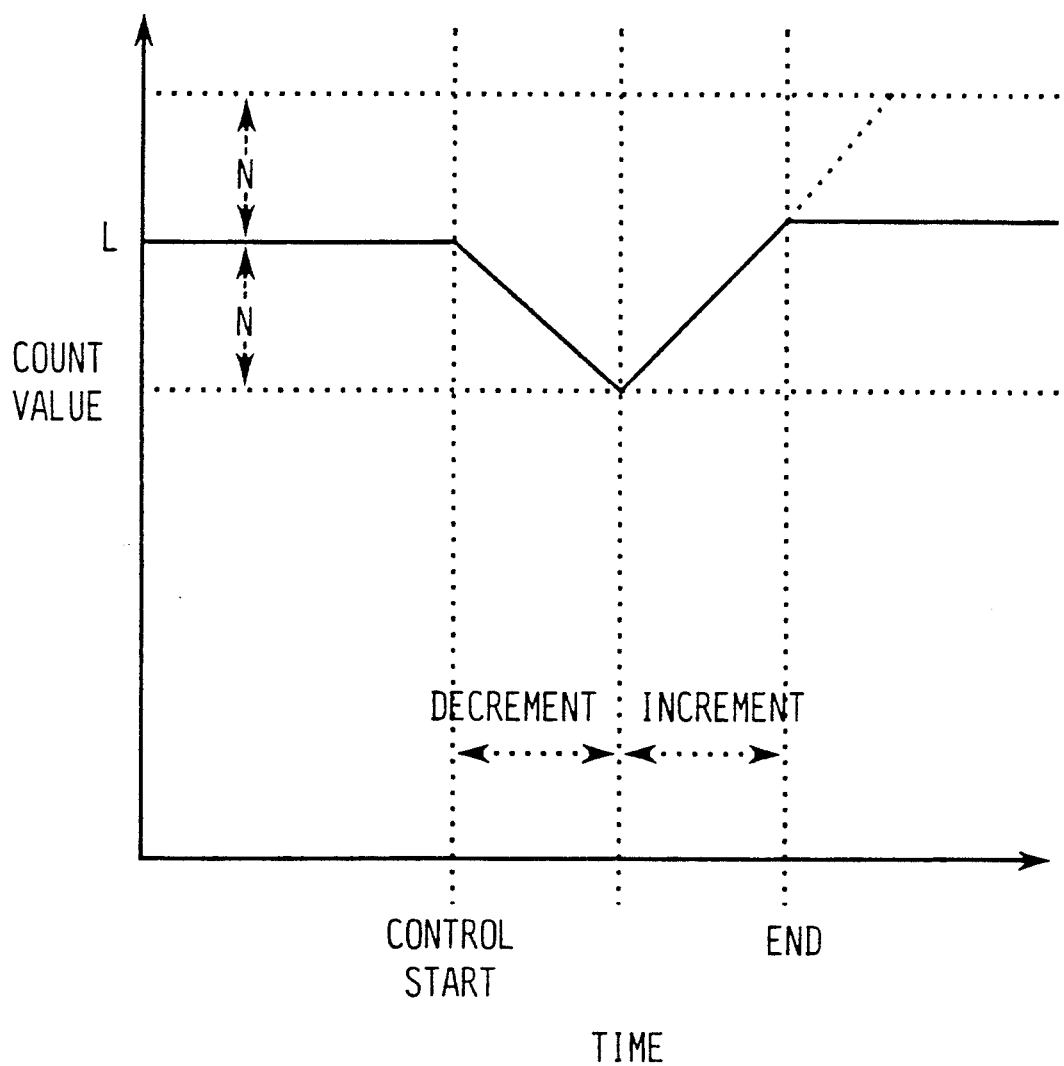
FIG. 8 is a diagram showing the changes of count values in an up-down counter in the second control operation.

Thus, since the second operation is carried out to keep the light intensity constant by changing the electric current flowing through the semiconductor laser element 1, the low-level light beam emitted from the laser element 1 is maintained constant in its intensity even when the temperature changes cause changes in the threshold current and the quantum differential efficiency of the laser element. The reason why the upper limit of the count value of the up-down counter 6b is value L+N is that the time capable of being consumed for the second control operation is in the intervals of the modulating operation and is limited. In the second control operation, the count value can change by value 2N. FIG. 8 shows how the count value changes.

Figure 9:
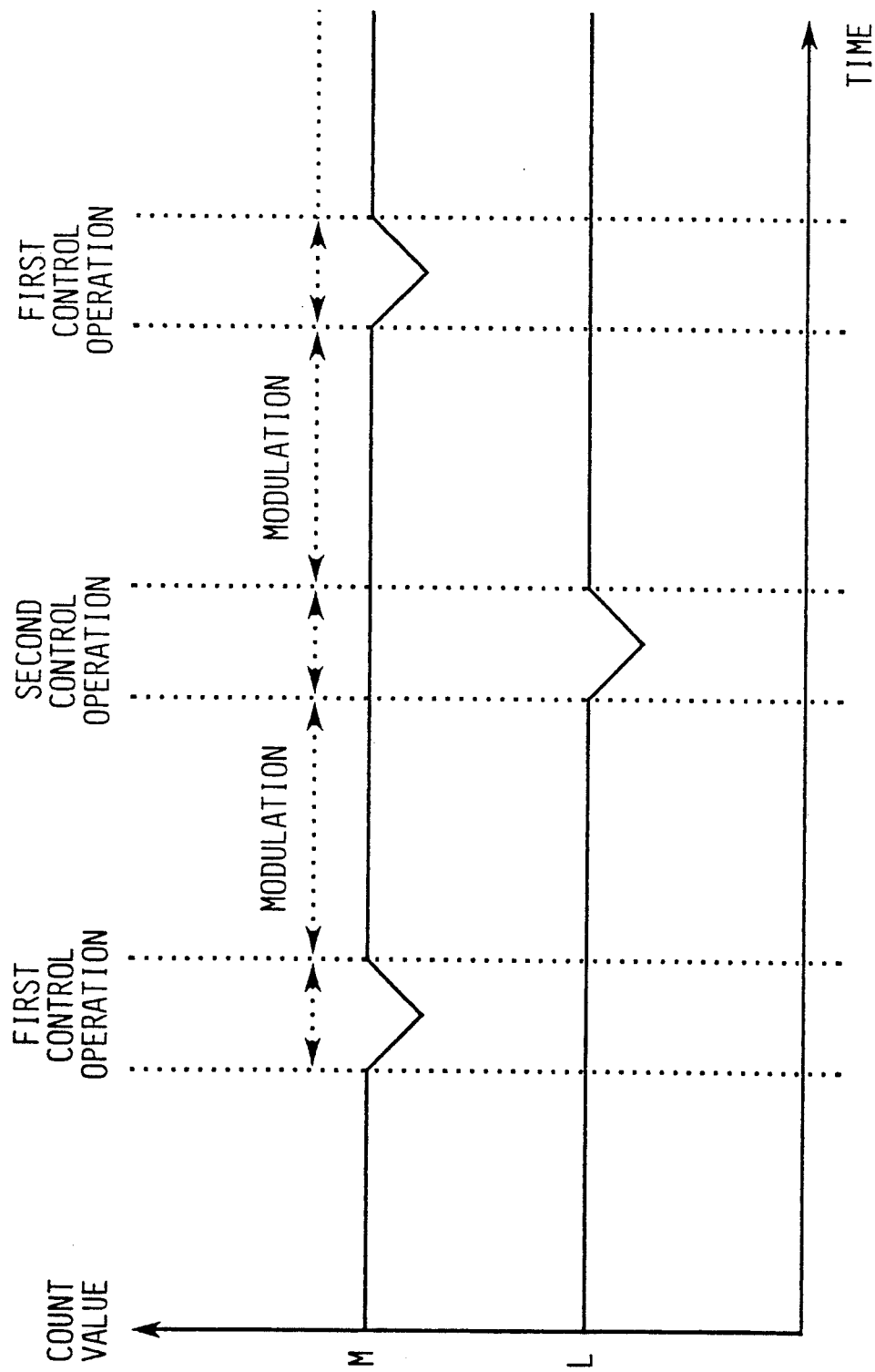
FIG. 9 is a diagram showing a time relation between a modulating operation and the first and second control operations.

As shown in FIG. 9, during the first and second control operations, based on the control signal output from the CPU 69B, the switch circuit 9 selects and outputs the analog signal from one of the D/A converters 7a and 7b in accordance with a signal provided from the sequencer 20. While the modulating operations of the laser beam during time TM is carried out, the switch circuit 9 selects and outputs the analog signal from one of the D/A converters 7a and 7b in accordance with an input recording signal read by the CPU 69B from the storage device 69A. The analog signal thus selected by the switch circuit 9 is input to a drive circuit 10, which in turn applies an electric current to the semiconductor laser element 1.

In the modulation operation of the laser beam, the switch circuit 9 selects one of the D/A converters 7a and 7b in accordance with the control signal output from the sequencer 20. The D/A converters 7a and 7b output analog signals based on digital signals which corresponding to data representing the count value stored in the RAM 69C.

The CPU 69B of the controller 69 reads the image data from the storage device 69A and transmits the image data to the laser driving circuit 68. The semiconductor laser member 61 is driven by the laser driving circuit 68 to emit the laser beam L in accordance with the image data which the CPU 69B reads from the storage device 69A. That is, when the image data indicates level 1 (or high level) which indicates that a latent image corresponding to the white color image is to be formed on the photoconductive drum 65, a recording signal corresponding to the level 1 is output to the laser driving circuit 68 by the CPU 69B. The switch circuit 9 selects the D/A converter 7a and an electric current corresponding to the count value of the up-down counter 6a is applied to the semiconductor laser 1 by the drive circuit 10, so that the laser element goes ON at a high-level light intensity.

Therefore, the laser driving circuit 68 controls the semiconductor laser member 61 so as to emit the laser beam L having the determined intensity for forming the latent image corresponding to the white color image on the photoconductive drum 65. When the image data indicates level 0 (or low level) which indicates that a latent image corresponding to the black color image is to be formed on the photoconductive drum 65, the recording signal corresponding to the level 0 is output to the laser driving circuit 68 by the CPU 69B. In the case where a recording signal indicates the level 0, the switch circuit 9 selects the D/A converter 7b and an electric current corresponding to the count value of the up-down counter 6b is applied to the laser element 1 by the drive circuit 10, so that the laser element goes ON at a low-level light intensity. Therefore, the laser driving circuit 68 controls the semiconductor laser member 61 having the determined intensity so as to emit the laser beam L for forming the latent image corresponding to the black color image on the photoconductive drum 65.

Referring now to FIG. 9, there is illustrated a time relation between the modulating operation and the first and second control operations. As shown in the same figure, the first and second control operations are performed in an alternate manner in the intervals of modulating operations, whereby the applied current of high level in the ON state and the applied current in the OFF state are adjusted alternately with each other and the respective light intensities are maintained constant independently of temperature changes. Further, since an electric current exceeding the threshold current is always flowing through the semiconductor laser element 1, it is possible to effect the ON-OFF operation at high speed, and the intensity of the laser light output in the modulating operation is stable in both the ON (high level) and the OFF (low level) states independent of temperature changes.

Therefore, the laser driving circuit 68 comprises the drive circuit 10 and the controller 69 comprises the sequencer 20, the switch circuit 9 which functions as the switch means, the clock generator 8 which functions as the signal producing means, the D/A converters 7a and 7b which function as the first and second D/A converter means, the up-down counters 6a and 6b which function as the first and second counter means, the comparators 5a and 5b which function as the first and second comparator means, the reference voltage generating units 4a and 4b which function as the high reference signal generating means and low reference signal generating means and the amplifier 3 in addition to the storage device 69A and the CPU 69B. The sequencer 20, the CPU 69B, the switch circuit 9, the clock generator 8, the up-down counter 6a, the D/A converter 7a, the reference voltage generating unit 4a, the amplifier 3 and the photodiode 2 function as the first control means and the sequencer 20, the CPU 69B, the switch circuit 9, the clock generator 8, the up-down counter 6b, the D/A converter 7b, the reference voltage generating unit 4b, the amplifier 3 and the photodiode 2 function as the second control means.

The present invention is not limited to the embodiment described in detail above but various modifications may be made. For example, although in the above embodiment two each comparator means and D/A converter means are used, only one of each may be used in a switchover manner. There may also be adopted a structure where the output of the second D/A converter means and the first D/A converter means are selected by the switch means to be added together and the result is fed to the application means. In this case, the same results as described above, will be obtained. Further, this invention can be applied to a laser driving system employed in an optical transmission device for transmitting light through an optical fiber.

While this invention has been described in connection with a specific embodiment thereof, many alternative modifications and variations will be apparent to those skilled in the art. Accordingly, the preferred embodiment of the invention as set forth herein is intended to be illustrative and not limitative. Various changes may be made without departing from the spirit and scope of the invention as defined in the following claims.

What is claimed is:

1. A semiconductor laser driving system, comprising:
a semiconductor laser element for emitting a laser beam, said semiconductor laser element having a characteristic where an intensity of the laser beam emitted from said semiconductor laser element is changed in accordance with a magnitude of an electric current applied to said semiconductor laser element;
applying means for applying the electric current to said semiconductor laser element; and
controlling means for controlling the electric current of said applying means so that a light intensity of the laser beam is kept at a constant first level when said semiconductor laser element is in a high emitting condition and that the light intensity of the laser beam is kept at a constant second level when said semiconductor laser element is in a low emitting condition when the electric current flows in said semiconductor laser element, the light intensity of the laser beam in the high emitting condition being higher than the light intensity of the laser beam in the low emitting condition, wherein said semiconductor laser element has a characteristic rate of change in the intensity of the emitted laser beam that is very rapid when the electric current applied to said semiconductor laser element is larger than a threshold current and the intensity of the laser beam has a very small rate of change when the electric current applied is below the threshold level.

2. The semiconductor laser driving system as defined in claim 1, wherein said controlling means controls the electric current of said applying means so that light intensity of the laser beam is kept constant even when temperature changes.

3. The semiconductor laser driving system as defined as claim 1, wherein said controlling means comprises a first control means which increases or decreases the applied electric current to maintain the constant light intensity when said semiconductor laser element is in the high emitting condition, and a second control means which increases or decreases the applied electric current to maintain the constant light intensity when said semiconductor laser element is in the low emitting condition.

4. The semiconductor laser driving system as defined in claim 1, wherein said semiconductor laser driving system is employed in an exposure apparatus of a recording system of an electrophotographic type and control is carried out when a modulation signal for the exposure apparatus of the recording system is not input.

5. The semiconductor laser driving system as defined as claim 1, wherein said controlling means comprises a light intensity detecting means for detecting the intensity of the laser beam emitted from said semiconductor laser element, a high-level reference signal generating means for generating a reference signal of a high level, a low level-reference signal generating means for generating a reference signal of a low level, first and second comparator means for making a comparison between a detected output provided from said light intensity detecting means and the two reference signals of high and low levels, signal producing means for producing a signal of a constant frequency, first and second counter means for successively counting signals of a constant frequency output from said signal producing means, first and second D/A converter means for converting the counted values provided from said first and second counter means into analog quantities, switch means for selecting one of said first and said second D/A converter means, and application means for applying an electric current to said semiconductor laser element on the basis of the selected analog signal.

6. A semiconductor laser driving system, comprising:
a semiconductor laser element for emitting a laser beam, said semiconductor laser element having a characteristic wherein an intensity of the laser beam emitted from said semiconductor laser element is changed in accordance with a magnitude of an electric current applied to said semiconductor laser element;
applying means for applying the electric current to said semiconductor laser element; and
controlling means for controlling said applying means so that a light intensity of the laser beam is kept constant when the laser beam is emitted in both of a high and a low emitting condition, the light intensity of the laser beam in the high emitting condition being higher than the light intensity of the laser beam in the low emitting condition, said controlling means comprising light intensity detecting means for detecting the intensity of the laser beam emitted from said semiconductor laser element, high-level reference signal generating means for generating a reference signal of a high level, low level-reference signal generating means for generating a reference signal of a low level, first and second comparator means for making a comparison between a detected output provided from said light intensity detecting means and the two reference signals of high and low levels, signal producing means for producing a signal of a constant frequency, first and second counter means for successively counting signals of a constant frequency output from said signal producing means, first and second D/A converter means for converting the counted values provided from said first and second counter means into analog quantities, switch means for selecting either said first or said second D/A converter means, and application means for applying an electric current to said semiconductor laser means on the basis of the selected analog signal, wherein the applied electric current is above a threshold current for both the high emitting and low emitting conditions of said semiconductor laser element and the intensity of the laser beam changes very rapidly in going from the low emitting condition to the high emitting condition whereas the intensity varies very slowly when the applied electric current changes below the threshold current.

7. A semiconductor laser driving system for an electrostatic printing system, comprising:
a semiconductor laser element for emitting a laser beam;
current applying means for applying an electric current to said semiconductor laser element; and
control means for controlling said current applying means to apply a low current to maintain said semiconductor laser in a low emitting condition for printing of dark record areas and a high current to move said semiconductor laser element to a high emitting condition for printing of non-colored record areas, both the low current and the high current being higher than a threshold current, wherein said control means comprises a light intensity detecting means for detecting the intensity of the laser beam admitted from said semiconductor laser element, a high-level reference signal generating means for generating a reference signal of a high level, a low level-reference signal generating means for generating a reference signal of a low level, first and second comparator means for making a comparison between a detected output provided from said light intensity detecting means and the two reference signals of high and low levels, signal producing means for producing a signal of a constant frequency, first and second counter means for successively counting signals of a constant frequency output from said signal producing means, first and second D/A converter means for converting the counted values provided from said first and second counter means into analog quantities, switch means for selecting one of said first and second D/A converter means, and application means for applying an electric current to said semiconductor laser means on the basis of the selected analog signal.

8. The semiconductor laser driving system as claimed in claim 7, wherein said control means establishes current levels for the low and high emitting conditions based upon the temperature of said semiconductor laser element.

9. The semiconductor laser driving system as claimed in claim 8, wherein said control means establishes the current levels for the low and high emitting conditions in an alternating manner.

* * * * *